US012704547B2

(12) United States Patent
Sauer et al.

(10) Patent No.: US 12,704,547 B2
(45) Date of Patent: Aug. 11, 2026

(54) AUTOMATED TEST EQUIPMENT AND METHOD USING A TRIGGER GENERATION

(71) Applicant: ADVANTEST CORPORATION, Tokyo (JP)

(72) Inventors: Matthias Sauer, Böblingen (DE); Olaf Pöppe, Tübingen (DE)

(73) Assignee: ADVANTEST CORPORATION, Tokyo (JP)

(*) Notice: Subject to any disclaimer, the term of this patent is extended or adjusted under 35 U.S.C. 154(b) by 37 days.

(21) Appl. No.: 18/946,120

(22) Filed: Nov. 13, 2024

(65) Prior Publication Data

US 2025/0067804 A1 Feb. 27, 2025

Related U.S. Application Data

(63) Continuation of application No. 18/099,613, filed on Jan. 20, 2023, now Pat. No. 12,467,973, which is a continuation of application No. PCT/EP2020/070601, filed on Jul. 21, 2020.

(51) Int. Cl.
*G01R 31/28* (2006.01)
*G01R 31/3183* (2006.01)
*G01R 31/319* (2006.01)

(52) U.S. Cl.
CPC ................ *G01R 31/318307* (2013.01); *G01R 31/31907* (2013.01); *G01R 31/31908* (2013.01)

(58) Field of Classification Search
None
See application file for complete search history.

(56) References Cited

U.S. PATENT DOCUMENTS

| | | | |
|---|---|---|---|
| 8,817,635 B2 * | 8/2014 | Mattisson | H04W 76/19 455/67.11 |
| 9,164,859 B2 | 10/2015 | Rivera Trevino et al. | |
| 2003/0208328 A1 | 11/2003 | Pickerd | |
| 2005/0208328 A1 | 9/2005 | Hsu | |
| 2008/0172588 A1 | 7/2008 | Olgaard | |
| 2009/0072838 A1 | 3/2009 | Shepherd et al. | |
| 2013/0093445 A1 | 4/2013 | Newman | |

(Continued)

FOREIGN PATENT DOCUMENTS

| | | |
|---|---|---|
| CN | 209562586 U | 10/2019 |
| JP | H01191070 A | 8/1989 |

(Continued)

*Primary Examiner* — Mujtaba M Chaudry

(57) ABSTRACT

An automated test equipment comprises a main test flow control configured to operate a test flow in multiple device communication units and/or to provide the trigger configuration information to a local compute unit. The automated test equipment further comprises a device communication unit comprising a trigger generation unit configured to generate a trigger signal. The trigger generation unit further configured to extract payload data from a protocol-based data stream received from the device under test, and to generate the trigger signal in response to the extracted payload data or in response to one or more protocol events. A method and a computer program for testing one or more devices under test in an automated test equipment are also disclosed.

20 Claims, 4 Drawing Sheets

(56) References Cited

U.S. PATENT DOCUMENTS

| | | | | |
|---|---|---|---|---|
| 2014/0254647 | A1* | 9/2014 | Stott | H04L 43/50 375/224 |
| 2016/0321159 | A1* | 11/2016 | Romm | G06F 11/364 |
| 2017/0227581 | A1 | 8/2017 | Knierim et al. | |
| 2018/0372780 | A1 | 12/2018 | Kelly et al. | |
| 2019/0113542 | A1 | 4/2019 | Daly-Jensen et al. | |
| 2019/0383873 | A1* | 12/2019 | Hojabri | G01R 31/3187 |
| 2020/0029286 | A1* | 1/2020 | Haley | H04W 56/001 |
| 2020/0033409 | A1* | 1/2020 | Hobbs | G11C 29/56016 |
| 2020/0280505 | A1* | 9/2020 | Aoki | H04L 43/50 |
| 2022/0397661 | A1* | 12/2022 | Vook | G01S 13/931 |

FOREIGN PATENT DOCUMENTS

| | | | |
|---|---|---|---|
| JP | 2002528706 | A | 9/2002 |
| JP | 2003329710 | A | 11/2003 |
| JP | 2010524341 | A | 7/2010 |
| JP | 2011257199 | A | 12/2011 |
| JP | 2014041120 | A | 3/2014 |
| JP | 2016085745 | A | 5/2016 |
| JP | 2017201295 | A | 11/2017 |
| TW | I324692 | B | 5/2010 |
| TW | I596352 | A | 8/2017 |

* cited by examiner

AUTOMATED TEST EQUIPMENT AND METHOD USING A TRIGGER GENERATION

CROSS-REFERENCE TO RELATED APPLICATIONS

This is a continuation of U.S. patent application Ser. No. 18/099,613 filed Jan. 20, 2023, which is a continuation of PCT Patent Application No. PCT/EP2020/070601 filed Jul. 21, 2020, both of which are incorporated herein in their entirety.

TECHNICAL FIELD

Embodiments according to the present invention are related to automated test equipment. Another embodiment according to the invention is related to a method for testing devices under test (DUTs). Generally speaking, embodiments according to the invention are related to generating a trigger signal in response to data received from a device under test (DUT). Embodiments according to the invention relate to an automated test equipment and method for a real-time trigger generation system close to the DUT interface.

BACKGROUND OF THE INVENTION

The increase in the complexity of electronic device structures comprising, for example, microprocessors, sensors, digital signal processors, etc., leads to the development of advanced techniques to test such electronic devices. For instance, automated test equipment is typically used for testing devices under test.

In an automated test equipment, the test-flows rely on the generation of trigger signals that results in changes in the test execution. In triggering structures, typically a specified event is signaled in the test execution flow and allows the flow to react on the event. In other words, based on the event signal applied to the triggering generation unit, a trigger signal is generated. The generation of trigger signals are, for example, required especially for interactive test-flows that depend on results from the device under test, which are comparable to interrupts in processing units.

It has been found that in conventional structures, in one aspect, transmission of data from a device under test to a central execution unit and a centralized generation of triggers approach typically cause unacceptable (i.e., high) transmission delay. It has been found that the central data bus (i.e., central data interface, or central communication interface) may, for example, provide a standardized transmission capacity and therewith high volume of data causes high traffic on the central data bus and a slow data exchange. It has been found that, accordingly, it becomes hard or impossible to maintain the signal (e.g., clock) accuracy which causes limited real-time performance and a limited multi-site efficiency.

In another aspect, the direct PC-based DUT connection approach is typically used. However, it has been found that such direct PC usage leads to limited multi-site possibilities. Further, it has been found that a direct PC-based device under test connection approach is unable to efficiently control tester resources such as e.g., power supplies. It has been found that therewith, it becomes hard or impossible to maintain the signal (e.g., clock) accuracy which causes limited real-time performance and limited multi-site efficiency.

In a third aspect, the real-time pattern comparison approach performed through a simple match-loop (i.e., simple match of pattern bit sequences) is typically used in conventional solutions at existing ADV cards. However, it has been found that, the comparison of pattern bits in real-time is not possible for non-deterministic (e.g., asynchronous transmission) interfaces due to the difficulty in bit synchronization and not possible for protocol aware (or protocol-aware communication). Moreover, the content-aware implementation is not possible due to the limited device specific information.

Techniques that disclose trigger generation upon receiving test result data from a device under test or trigger generation directly in the device under test have been proposed. For example, in US Patent Application Publication No. 20180372780A1 discloses a test and a measurement equipment enabling to output a trigger signal upon receiving signals from a device under test. US Patent Application Publication No. 20190383873A1 discloses a test and measurement device, receiving input data from a device under test only after certain situations have occurred, and therewith detecting the anomalies through pattern comparison. In US Patent Application Publication No. 20090072838A1, a trigger signal derived from a device under test is disclosed. In U.S. Pat. No. 9,164,859B2 a method for enabling concurrent testing of the devices under test is disclosed.

In view of the above, there is a desire for a test concept which brings along an improved compromise between test coverage, timing accuracy, latency, and implementation effort.

SUMMARY OF THE INVENTION

The present technology may best be understood by referring to the following description and accompanying drawings that are used to illustrate embodiments of the present technology directed toward trigger generation techniques for automated test equipment (ATE).

An embodiment according to the invention provides an automated test equipment for testing one or more devices under test, comprising a main test flow control, which may, for example, be configured to operate (or coordinate) a test flow in multiple device communication units and/or to provide the trigger configuration information. The automated test equipment further comprises a device communication unit which is coupled to the main test flow control via a tester interface (e.g. a common or a shared tester interface, e.g. a communication interface (bus)) and which is adapted to interface with one or more devices under test. The device communication unit may, for example, be coupled with one or more devices under test via one or more DUT interfaces.

Moreover, the device communication unit comprises a trigger generation configured to generate a trigger signal in response to data (e.g., a protocol-based data stream) received from a device under test. For example, the data may be received from the device under test via a device under test interface.

Furthermore, the trigger generation is configured to extract payload data from a protocol-based data stream (e.g., a non-deterministic and/or protocol-aware data stream) received from the device under test, and to generate the trigger signal in response to the extracted payload data or in response to one or more protocol events.

The described automated test equipment is based on the insight that a latency may be reduced and bottlenecks may be avoided by providing a protocol-aware trigger generation on a device communication unit, i.e. very close to the device under test. Accordingly, significant improvements over conventional solutions, in which a real-time trigger generation unit may not be close to the device under test interface (or channel), causing a communication latency during the interactive test flow, may be achieved. The described embodiments are therefore based on the idea to use the protocol-aware trigger generation unit which is part of the device communication unit and which is coupled to the device under test via solely a device under test interface. Such close coupling of trigger generation unit to the device under test interface enables short communication latency (since it is not necessary to forward a full data stream via the tester interface between the main test flow control and the device communication unit), a better timing prediction (i.e., time synchronization) due to a short path and a real-time performance (or processing) capability.

The embodiments herein consider the real-time requirements for trigger generation such as keeping a minimal latency between the event itself and the communication of the trigger or the reaction of the test execution flow. In other words, the (protocol-aware) trigger generation unit is part of the device communication unit (not part of the main test flow control that may generate the trigger data with a high latency due to the high traffic of data in the main test flow control) to minimize the communication latency.

Moreover, a time determinism is, in some cases, another real-time requirement for trigger generation. Time determinism is achieved, for example, by allowing cycle accurate back mapping for trigger generation and trigger communication (or broadcast). For example, a finite state machine considers predictable number of clock cycles (back-mapping or back-computation) to determine the time of trigger. However, by providing a protocol-aware trigger generation directly on the device communication unit, timing inaccuracies, which may conventionally be caused by congestion on a tester bus, can be avoided.

Thus, by providing the functionality to evaluate a protocol-based data stream from the device under test directly on the device communication unit, and to provide a trigger on the basis of an evaluation of the protocol-based data stream (e.g., on the basis of payload data extracted from the data stream, or on the basis of a protocol event (like a certain protocol state, if the protocol may be considered as a state machine, or a protocol error), a particularly fast reaction to one or more predetermined events (e.g., a provision of predetermined data by the device under test in the data stream, or a protocol violation in a data stream provided by the device under test) may be achieved while avoiding latencies of a tester interface between the main test flow control and the device communication unit.

Moreover, the trigger generation on the device communication unit may be dedicated to the testing of a single device under test coupled (e.g., directly, without any active circuitry in between) to the device communication unit, which in turn allows for a faster reaction when compared to a processing (e.g., trigger generation) in the main test flow control which is typically responsible for a parallel testing of a plurality of devices under test (such that processing power must be shared between a plurality of devices under test).

Furthermore, according to an aspect, more advanced requirements may be specified for the trigger definition due to the insufficiency of simple bit-compare for devices with protocol interfaces. Moreover, the real-time trigger generation may, for example, handle the device specific information (e.g., encryption, ID), handshake protocol, device parameters, sensor readings, package counters, packetized protocols and non-determinisms due to the communication interfaces. Thus, the communication interface may, for example, send data to the device under test and may, for example, receive data from the device under test that is formatted according to the defined protocol.

In one embodiment, the device communication unit is configured to communicate a trigger event to the main test flow control (which, for example, orchestrates (e.g. operates or coordinates) a test flow in multiple device communication units) or to another device communication unit via the tester interface (e.g., communication interface (bus)). Accordingly, the main test flow control may, for example, be enabled to adapt a test flow in response to the communication of the trigger event, to thereby react to the trigger event. However, by communicating only an information describing a detection of the trigger event to the main test flow control, and amount of data to be transmitted to the main test flow control and a processing load of the main test flow control may be significantly smaller when compared to a case in which the full (protocol based) DUT data stream would be sent to the main test flow control (and in which the main test flow control evaluates the DUT data stream). Accordingly, the main test flow control can "concentrate" on the overall control (and/or coordination) of one or more test flows (e.g., with respect to a parallel testing of multiple DUTs), while the (protocol-based) generation of the trigger information is performed in a decentralized manner by the device communication unit.

In an embodiment, the tester interface (e.g., communication interface (bus)) is deterministic with respect to a time needed for a data transmission. In other words, the time determinism (e.g., synchronous transmission) may enable to predict the number of cycles per a certain time duration for a data transmission in order to guarantee the data delivery without resend. Accordingly, the main test flow control may react to information about a trigger event provided by the device communication unit within a well-predictable period of time. Accordingly, a reaction to a trigger event may be time-deterministic, even though the trigger generation is in the device communication unit, which is separate from the main test flow control.

In an embodiment, the tester interface is configured to allow for a bidirectional communication between the main test flow control and the at least one device communication unit. In other words, the bidirectional tester interface is configured to send (or provide) the trigger data to the main test flow control (e.g., from the device communication unit) and is configured to receive, for example, the trigger configuration information from the main test flow control. Moreover, the bidirectional tester interface is configured to communicate the trigger configuration information to at least one device communication unit and is configured to receive the trigger signal from the device communication unit. Accordingly, the main test flow control may setup the trigger condition which is evaluated by the trigger generation, and may receive the trigger data (e.g., information or a dedicated message indicating a detection of a trigger event by the trigger generation), such that the main test flow control has control over the trigger process. Also, the main test flow control may adapt a test flow in response to reception of a trigger signal (or a dedicated trigger message), and may, for example, send trigger messages to one or more other device communication units in response to the reception of a dedicated trigger message.

In an embodiment, the trigger generation is configured to extract the payload data from a packetized data stream and/or from a sequential bit stream on one or more pins. This may, for example, imply that the packetized data stream which includes the data and the format of a certain protocol (e.g., IJTAG, JTAG, USB, Ethernet, SATA) is read by the trigger generation when extracting the payload data from the packetized data stream (i.e., protocol-based data stream). Moreover, the sequential bit stream on possibly multiple pins in parallel are read by the trigger generation in order to extract the payload data. Accordingly, the trigger generation processes data provided at a pin of the DUT in a very direct manner, which allows for very small latencies and avoids a data transfer via internal interfaces of the automated test equipment (which might cause delays and constitute a bottleneck).

In an embodiment, the trigger generation is configured to evaluate one or more protocol-aware (i.e., protocol-based) communications between the device communication unit and the device under test, and to generate the trigger signal on the basis of payload data of the one or more protocol-aware (e.g., protocol-based) communications. The protocol-aware communication may, for example, include the response of sensor data (or sensor data itself) which may enclose (or may allow a detection of) the heating anomaly in the device under test. Upon the extraction of protocol-aware data stream, the trigger generation unit may generate the trigger signal. Accordingly, the trigger generation may even evaluate and respond to (e.g., by providing a trigger signal) analog characteristics of the device under test (like a DUT temperature, or a DUT supply voltage, or a DUT supply current, or any other DUT parameter) which are communicated by the device under test via a digital protocol-based interface. In other words, the trigger generation may respond to one or more DUT parameter values, which are represented in a digital form in a protocol-based data stream provided by the DUT. Accordingly, it may no longer be necessary to evaluate analog quantities-which are prone to distortion and typically difficult to handle-representing DUT parameters in the device communication unit.

In an embodiment, the trigger generation is configured to extract the payload data from a raw device under test communication, and to generate the trigger signal on the basis of the payload. Accordingly, the trigger generation may generate the trigger on the basis of the payload data, which may, for example, be generated in a well-defined manner by a software running on the DUT, or which may be generated by a hardware unit of the DUT. By evaluating payload data of a protocol-based communication for a triggering, a mechanism is created which allows a DUT (or software running on a DUT) to efficiently determine (or modify) a test flow. Furthermore, by evaluating the payload (e.g., by evaluating a magnitude of a digital values included in the payload), a triggering can be made in dependence on a (multi-bit) numeric information represented by the payload.

In an embodiment, the trigger generation is configured to generate the trigger signal in response to data (e.g., payload data) received from a device under test via a JTAG interface, or via an IJTAG interface, or via a boundary scan interface, or via a USB interface, or via an Ethernet interface, or via a SATA interface, or via a debug interface, or via a High-Speed IO interface according to e.g. IEEE 1149.10, or wireless interface according to e.g. IEEE 802.11, or 3GPP LTE, or 3GPP 5G. Moreover, low level interfaces (e.g., the debug interface) enable a direct access to a hardware component of a device under test and on the other hand, high bandwidth interfaces (HighSpeed IO, or Ethernet interface, etc.) enable to communicate large amount of program code or data to or from the device under test at a high speed. Accordingly, using different interfaces enables to have an efficient data exchange architecture. Moreover, it has been found that triggering on a data stream of such protocol-based interfaces allows for a good control of a test flow and may help to detect communication errors which may result from a defect of the DUT.

In an embodiment, the trigger generation is configured to generate a compare information (e.g., a compare sequence) and to generate the trigger signal on the basis of the compare information and the extracted payload data (e.g., using a comparison of the compare information and the extracted payload data). The extraction of payload data is, for example, out of the direct data which is provided by the device under test. In other words, the extraction of payload data enables unwrapping the protocol data from the direct data. Moreover, the generation of compare information, which may, for example, be performed in advance (e.g., before a test execution) or which may be performed "just in time," e.g., during a test execution, allows for a trigger generation with high speed and low computational effort. For example, a simple data comparison may be used after unwrapping the payload data from the protocol, which can be performed with small hardware effort at very high speed.

In an embodiment, the trigger generation is configured to generate the compare information on the basis of a trigger configuration information which may, for example, be provided by the main test flow control, and which may, for example, be identical for a plurality of devices under test and on the basis of a device under test specific information which may, for example, be specific to a device under test, and comprise a device under test identifier and/or an encryption information. The predetermined trigger configuration information provides, for example, the sensor temperature value of 50° and the device under test specific information, for example, identifies the n-th device under test. Thus, the trigger generation is configured to generate the compare information indicating the n-th device under test having the sensor temperature value of greater than 50°. Such a concept allows to keep an amount of data, which has to be distributed by the main test flow control, reasonably small. Rather than providing a large amount of different (DUT-individual) "full" compare information to a plurality of trigger generations (e.g. of different device communication units), it is sufficient to distribute a common compare information and a comparatively small amount of device specific (or device-individual) information to the different trigger generations. Thus, an amount of data communicated within the automated test equipment can be reduced, which is important in order to perform a simultaneous testing of multiple DUTs.

In an embodiment, the trigger generation comprises a hardware circuit (e.g. a configurable hardware trigger circuit, which may, for example, comprise a hard-wired signal flow) configured to compare the compare information (e.g. a locally computed "compare sequence") with the extracted payload data. In other words, the hardware circuit (e.g., implemented in a field programmable gate array (FPGA) or an application specific integrated circuit (ASIC)) is configured to compare the expected data with the acquired extracted payload data in which the extraction of payload data is out of the direct data which is provided by the device under test. Using a hardware circuit for the trigger generation allows for particularly high data rates and helps to keep latencies small. Also, a good timing behavior can be achieved because there are typically well-predictable delays.

In a preferred embodiment, the trigger generation is configured to provide a trigger signal comprising one or more of the following information items:

A timestamp describing a time at which a trigger event is detected. The timestamp of the trigger signal indicates the measured number of clock cycles relating to a reference point (e.g., global reference point).

Information about a trigger type. The trigger type considers the temperature, and/or the payload data, and/or the protocol event, and/or the trigger ID. The trigger type identifies one out of multiple trigger events.

Information about a trigger origin (e.g., information about which DUT, out of a plurality of DUTs, has caused the trigger event, or information whether DUT payload data or a component of the device communication unit has caused the trigger event). In other words, it indicates the information about a trigger source which causes the trigger event.

Information about payload data (e.g., in an environment before the trigger event is detected, or in an environment after the trigger event is detected).

Information about a trigger target (e.g., an information indicating which unit of the automated test equipment should react to the detection of the trigger event). In other words, the information indicates the target unit of the automated test equipment for trigger generation.

Information about a trigger priority (e.g., if multiple trigger conditions having different priorities are defined). For example, priorities may be defined by the levels of high, medium or low and the trigger data may be processed one by one according to their trigger priority.

Information about an age (e.g., information about a time between the detection of the trigger event and a signaling of the trigger event, e.g. via the tester interface). The information about the trigger age may be specified through the number of clock cycles between the time of the trigger event detection (e.g., from the extraction of payload data unit) and the signaling of the trigger event (e.g., from the generation of trigger signal unit).

Thus, the trigger signal is very meaningful and allows for a precise analysis of the trigger event.

In an embodiment, the automated test equipment comprises a central trigger signal distributor configured to receive a trigger signal from a device communication unit and to forward the trigger signal to another device communication unit or to another trigger target (e.g., a tester device which performs an action in response to the trigger signal, e.g., changes a voltage or a signal parameter of a signal provided to the DUT causing the trigger event). Moreover, the trigger signal distribution may, for example, be accomplished through communication with the tester interface (i.e., communication interface (bus) or, generally speaking, to a data interface) and listening of target DCUs on the tester interface. By distributing the trigger signal or trigger information in such a manner, a coordination between a plurality of device coordination units may be achieved, which is particularly helpful if multiple device communication units cooperate to test a single DUT. Also, additional tester instruments may be time-synchronized or adjusted in response to a trigger event, which allows for a well-controlled test which is responsive to different DUT reactions.

In an embodiment, the automated test equipment comprises one or more further device communication units coupled to the tester interface (i.e., communication interface (bus)), wherein at least one of the one or more further device communication units (e.g., a target device communication unit) is configured to detect a trigger signal on the tester interface which is provided by a source device communication unit, and to react to the detection of the trigger signal on the tester interface. Accordingly, an operation of multiple device communication units (and, in particular, a reaction to a trigger event) can be synchronized in an efficient manner, wherein the synchronization may be performed without an involvement of the main test flow control. Accordingly, low latencies can be achieved, and the load of the main test flow control can be kept low.

In an embodiment, the automated test equipment comprises one or more further device communication units coupled to the tester interface (i.e., communication interface (bus)), wherein at least one of the one or more further device communication units (e.g., a target device communication unit) is configured to receive a dedicated trigger signal from a source device communication unit (e.g. using a loopback over the load board), and to react to the reception of the dedicated trigger signal. In other words, the trigger data may, for example, be sent directly to the target device communication unit, for example, not through the tester interface. Accordingly, a load of the tester interface can be kept very small, and latencies can be reduced to a very low value, since a dedicated trigger line can be used for the transmission of the dedicated trigger signal.

In an embodiment, the trigger generation is configured to evaluate a match of payload data (or of a bitstream) according to a perfect match trigger condition, and/or according to a partial match with wildcards trigger condition, and/or according to a regular expression trigger condition, in order to generate the trigger signal. In particular, the bit stream may be the extracted payload data, for example, the binary representation of the payload data or the protocol event information. In the trigger compare process, the bit stream may have, for example, a perfect or partial match trigger condition or a syntax-based condition such as parsing (e.g., context-based condition). Moreover, the trigger compare process may, for example, comprise different states such as an activate state of trigger by (or for) firing if activation condition is matched or a disable state of trigger by no matching of activation condition (or deactivation after certain time) or an enable state of trigger by (or to) enable matching of activation condition (pre-condition for triggering (e.g., intermediate state, wait for an event to switch to the activate state)). Accordingly, a flexible triggering concept is provided. For example, it is possible to have a multi-step triggering (e.g., with an intermediate "activate state" which may, for example, be reached from an "enable state"), which allows to implement complex trigger conditions. Moreover, by using wildcards (e.g., don't cares) and regular expressions (which may be efficiently evaluated by the trigger generation), it is possible to consider an actual payload of the data stream when deciding about the triggering.

In a preferred embodiment, the trigger generation is configured to evaluate a match of payload data (or of a bitstream) according to a cycle-after-reference trigger condition, in order to generate the trigger signal. This may, for example, imply that the device under test and the device communication unit time synchronization is achieved by using a global synchronization reference (e.g., from one of global navigation satellite system such as global positioning system, or from a common synchronization signal) for the activate state of trigger by firing if activation condition is matched or the disable state of trigger by no matching of activation condition (or deactivation after certain time) or the enable state of trigger by enable matching of activation condition (pre-condition for triggering (e.g., intermediate state, wait for an event to switch to the activate state)). Consequently, a good timing synchronization, for example, between different device communication units or between different test instruments, can be achieved. Also, a deterministic timing can be achieved, which allows for an analysis of the trigger event, e.g., when performing a debugging of a test program or a fault analysis.

In an embodiment, the trigger generation is configured to evaluate a match of payload data (or of a bitstream) according to a numerical operation compare trigger condition, in order to generate the trigger signal. Thus, numerical values of the payload data may, for example, be used to decide about the triggering. Consequently, a triggering can be made in dependence on whether payload data of the DUT data stream indicate a certain numerical value or not.

In a preferred embodiment, the trigger generation is configured to evaluate a match of payload data (or of a bitstream) according to a minimum number of matches trigger condition or according to a maximum number of matches trigger condition, in order to generate the trigger signal. Thus, the triggering can be made very flexible.

Embodiments provide a method for testing one or more devices under test comprising a trigger signal generation in response to data (e.g., payload data) received from a device under test (DUT) (e.g. data received from the DUT via a DUT interface). Moreover, the generation of the trigger signal comprises extracting payload data from a protocol-based data stream (e.g., a non-deterministic and/or protocol-aware data stream) received from the device under test, and generating the trigger signal in response to the extracted payload data or in response to one or more protocol events. This method is based on the same considerations like the above described apparatus.

However, it should be noted that the method described here may optionally be supplemented by any of the features, functionalities and details disclosed herein, also with respect to the automated test equipment. It should be noted that the method may optionally be supplemented by such features, functionalities and details both individually and taken in combination.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments according to the present invention will subsequently be described taking reference to the enclosed figures in which.

DETAILED DESCRIPTION OF THE INVENTION

Figure 1:
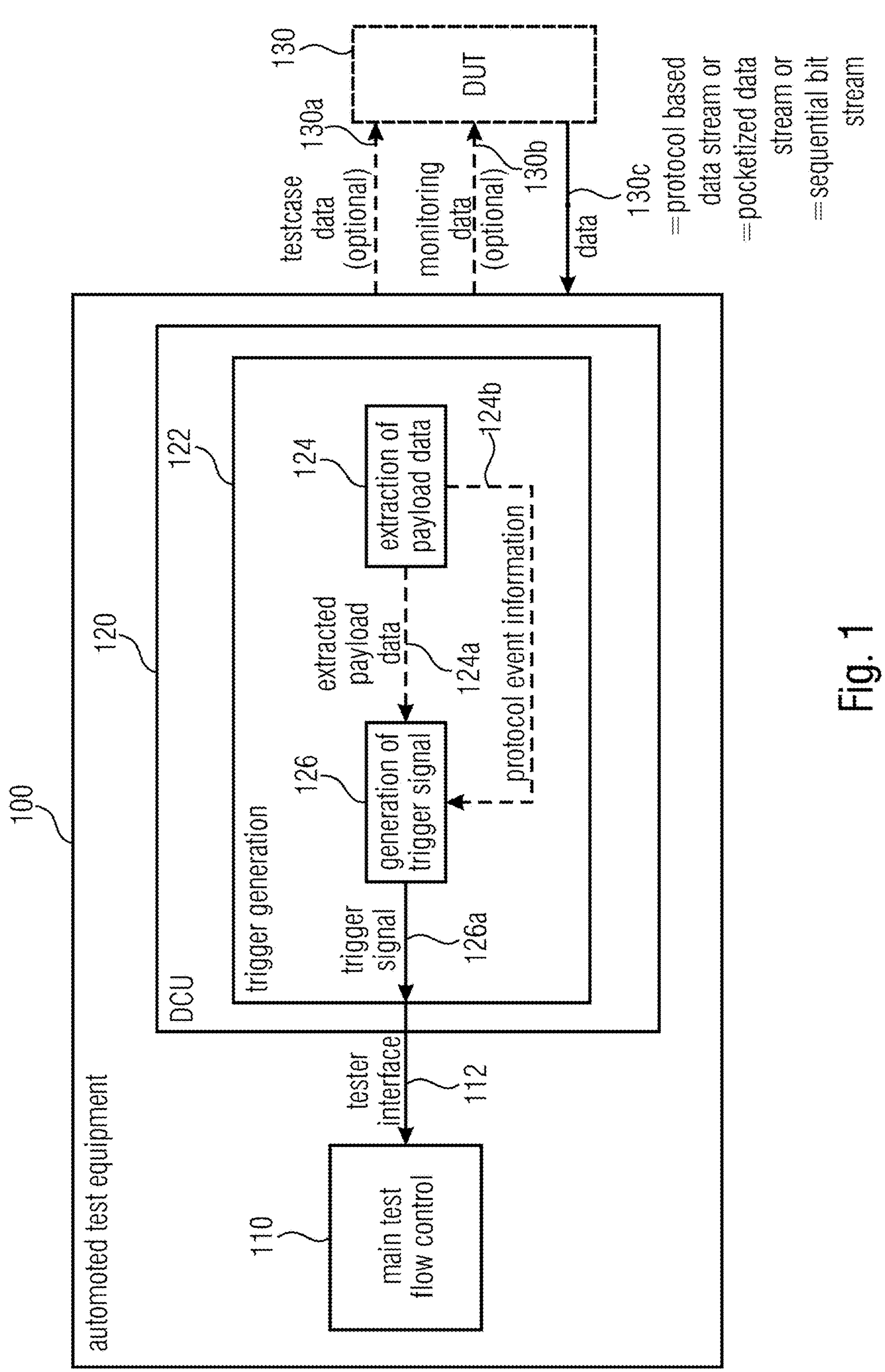
FIG. 1 shows a block schematic diagram of an automated test equipment for generating a trigger signal in response to data received from the device under test.

Reference will now be made in detail to the embodiments of the present technology, examples of which are illustrated in the accompanying drawings. While the present technology will be described in conjunction with these embodiments, it will be understood that they are not intended to limit the technology to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. The use of the terms "comprises," "comprising," "includes," "including" and the like specify the presence of stated elements, but do not preclude the presence or addition of one or more other elements and or groups thereof. It is also to be understood that although the terms first, second, etc. may be used herein to describe various elements, such elements should not be limited by these terms. These terms are used herein to distinguish one element from another. For example, a first element could be termed a second element, and similarly a second element could be termed a first element, without departing from the scope of embodiments. It is also to be understood that when an element is referred to as being "coupled" to another element, it may be directly or indirectly connected to the other element, or an intervening element may be present. In contrast, when an element is referred to as being "directly connected" to another element, there are not intervening elements present. It is also to be understood that the term "and or" includes any and all combinations of one or more of the associated elements. It is also to be understood that the phraseology and terminology used herein is for the purpose of description and should not be regarded as limiting.

Automated Test Equipment According to FIG. 1

Referring now to FIG. 1, a block schematic diagram of an automated test equipment 100, according to an embodiment of the present invention, is shown. The automated test equipment 100 comprises a main test flow control 110, wherein the main test flow control is configured to operate (e.g. orchestrate) a test flow to all sites (i.e., operates or controls an overall test flow to test the device under test or to simultaneously test a plurality of devices under test). The automated test equipment 100 comprises a device communication unit 120 which further comprises a trigger generation 122. The trigger generation 122 comprises an extraction 124 of payload data, wherein the extraction 124 of payload data is, for example, configured to provide the extracted payload data 124*a* and/or the protocol event information 124*b*, which are based on the data (or data stream, or DUT data or DUT data stream) 130*c* provided by the device under test 130. The trigger generation 122 further comprises a generation 126 of trigger signal, wherein the generation 126 of trigger signal is configured to generate the trigger signal 126*a*, and may, for example, be configured to send (e.g., output, or transmit) the trigger signal 126*a* to the main test flow control 110 via a tester interface 112.

Moreover, the automated test equipment 100 is optionally configured to provide the test case data 130*a* (e.g., an appropriate test code uploaded to the device under test) and the monitoring data 130*b* (e.g., a monitor program which is used to upload and/or start and/or interrupt the test execution) to the device under test and to receive the data 130*c* (e.g., the response data) from a device under test 130.

Accordingly, in the automated test equipment 100, the trigger generation unit 122 which is part of the device communication unit 120 is, for example, directly coupled to the device under test, for example, solely through a device under test interface (not explicitly shown in FIG. 1). The close coupling of trigger generation unit 122 to the DUT interface provides typically a better timing prediction due to the short path and less latency and thus provides a continuous real-time performance (or processing) capability.

To conclude, the automated test equipment 100 allows for a decentralized and protocol-aware trigger generation, wherein it is not necessary to forward the full DUT data to the main test flow control. Rather, a trigger generation takes place in the "decentralized" trigger generation unit 122, which is a part of the device communication unit. For example, the trigger generation unit may receive the DUT data "in its original form" (e.g., without an intermediate transmission over an automated-test-equipment-internal interface, like the tester interface) and may evaluate DUT data 130 considering the communication protocol underlying the DUT data. Accordingly, the trigger generation 126 may generate the trigger signal 126*a* on the basis of a payload extracted from the (protocol-based) DUT data and/or on the basis (or in response to) a detection of one or more protocol events. Accordingly, an elaborate evaluation functionality, which is capable of evaluating a communication protocol underlying the DUT data 130*c*, is provided in a decentralized manner in the device communication unit, which allows for a fast (e.g. real-time-capable) trigger generation while keeping a data volume transmitted over the tester interface 122 and a processing load of the main test flow control low.

Furthermore, it should be noted that the automated test equipment 100 can optionally be supplemented by any of the features, functionalities and details disclosed herein, both individually and taken in combination.

Figure 2:
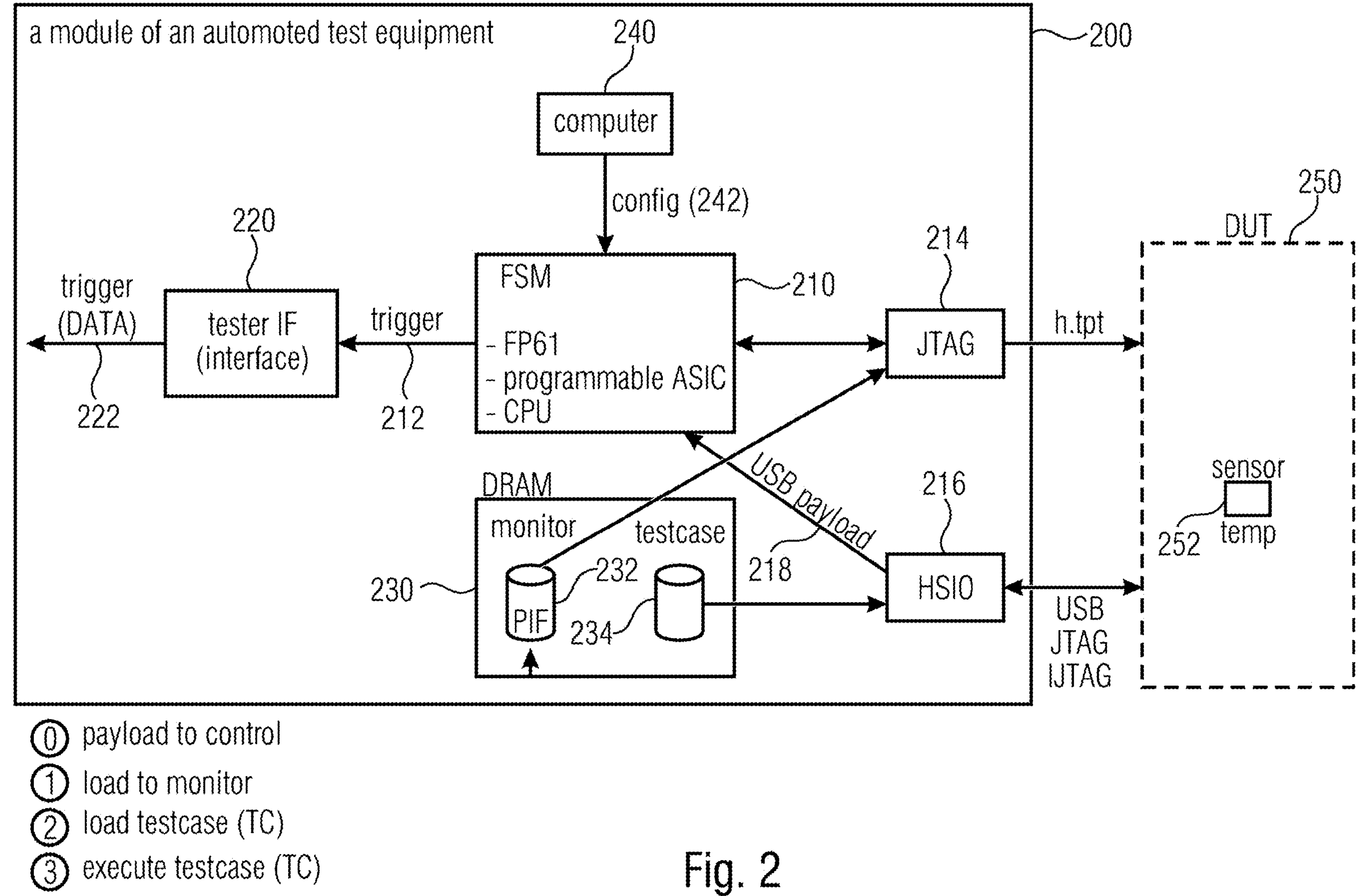
FIG. 2 shows a block schematic diagram of a module of an automated test equipment for generating a trigger signal in response to data received from the device under test.

Reference Example According to FIG. 2

Referring now to FIG. 2, a block schematic diagram of a module 200 of an automated test equipment, according to an embodiment of the present invention, is shown. The module (e.g., a part) of the automated test equipment 200 comprises a finite state machine (FSM) 210, wherein the finite state machine 210 may, for example, be the main control block, i.e., controlling the functionality of the architecture of a module of the automated test equipment 200. In this regard, it should be noted that, in comparison to the generation 126 of trigger signal of the automated test equipment 100, the finite state machine 210 may have a broader functionality.

Moreover, the finite state machine 210 may, for example, be implemented in hardware (e.g., using an FPGA or an ASIC) or software (e.g., using a CPU). The module 200 of the automated test equipment further comprises a tester IF (Interface) 220 wherein the tester IF 220 is configured to receive the trigger signal 212. Moreover, the module 200 of the automated test equipment comprises a random-access memory (e.g., a dynamic random-access memory (e.g. a DRAM) 230 or a static random access memory) which further comprises, for example, a monitor 232 and a testcase 234. The monitor 232 may, for example, be a monitor program which can be provided (e.g., under the control of the finite state machine 210) to the device under test 250 via a debug interface (e.g., a low-level interface or a hardware interface) (e.g., JTAG). For example, the monitor 232 is used to control a test execution on the side of the DUT 250 when being executed by a processor or a CPU of the DUT 250. For example, the monitor may control an upload of a testcase to the DUT and/or an execution of the test case on the DUT. In other words, the monitor may, for example, support a sending of the testcase 234 to the device under test 250 via HighSpeed IO interface 216. In other words, the monitor program is used to upload and/or start and/or interrupt the test execution. Also, the monitor 232 may, for example, be capable of evaluating (or pre-evaluating) results of a test execution on the DUT.

Furthermore, the testcase may be used for uploading an appropriate test program or appropriate test data to the device under test 250. For example, the test case may comprise a definition of a test program and/or of test data. Moreover, the test case 234 may, optionally, comprise configuration information for receiving a payload data (e.g., a response data) from the device under test 250 and for forwarding the response data to the finite state machine 210.

It should be noted that the testcase 234 may, for example, be configured to provide a testcase program, wherein the testcase program may, for example, comprise both a test data or a test program to be processed or to be executed on the device under test 250 and a program code to be executed by the automated test equipment, or by the finite state machine 210 of the automated test equipment.

The module 200 of the automated test equipment further, optionally, comprises a compute unit 240 providing the config or configuration 242 (e.g., the trigger configuration information) to the finite state machine (FSM) 210. In other words, the compute unit 240 may be an engine that configures the FSM 210. The compute unit may, for example, provide the configuration information, which may define the trigger functionality, on the basis of data provided by a main test flow control which may, for example, be temporarily stored in the random-access memory or DRAM 230. The module 200 of the automated test equipment may, for example, communicate with the device under test 250 (i.e., an external device) through the HighSpeed IO interface 216 (for example, in addition to a communication via a test interface, like JTAG, iJTAG, or the like).

Furthermore, the finite state machine 210 may, for example, switch from one state to another in order to control a test of a DUT. In some cases, as switching between states may occur in response to the payload data 218 (or USB payload data, JTAG payload data or IJTAG payload data). For example, the states may change in between: 0) Payload to control (wherein, for example data may be provided from the main test flow control to the module or device communication unit 200); 1) Load monitor (wherein, for example, a monitor program 232 may be uploaded from the random access memory or DRAM 230 to the DUT 250); 2) Load testcase (wherein, for example, a test case 234 may be uploaded from the random access memory or DRAM 230 to the DUT 250); and 3) Execute testcase (wherein, for example, the test case 234 may be executed, e.g. under the control of the monitor program or started by the monitor program). In the following, the state flow transitions of the finite state machine 210 will be described in more detail with an application scenario.

One or more sensors 252 on the device under test 250 (e.g., on-chip sensors) may, for example, be configured to capture impending anomalies of on-chip structures by measuring the average temperature. In one application scenario, the finite state machine (FSM) 210 may, for example, initially, in state 0, control the transfer of a payload (e.g., from the main test flow control to the module 200). In state 1, the monitoring program may be uploaded to the DUT, and in state 2, the testcase data may be uploaded to the DUT, and the tests may be executed in state 3, e.g., until the on-chip sensor data reaches a pre-determined temperature value. When the trigger condition is satisfied (e.g., upon a certain triggering event) (e.g. when the temperature value measured by the sensor 252 and encoded in a protocol-based DUT data stream reaches a predetermined value), (e.g. when sensor data represented by a sensor data stream received (or acquired) from the device under test 250 through the HighSpeed IO interface 216 match a trigger condition defined by the trigger configuration information 242), the FSM 210 may trigger a sequence (or a state transition).

The module 200 of the automated test equipment further comprises a HighSpeed IO interface 216 (e.g., universal serial bus (USB), internal JTAG (IJTAG), ethernet, serial advanced technology attachment (SATA)) enabling faster on-chip testing than typical dedicated interfaces (e.g., dedicated test interfaces). The HighSpeed IO interface 216 may, for example, be used to send (i.e., output, or transmit) testcase data to the device under test 250 or to receive payload data 218 embedded in a DUT data stream according to a protocol (e.g., USB payload data, JTAG payload data, IJTAG payload data) from the DUT and provide the payload data to the FSM 210, or to receive data from the random access memory or DRAM 230 and forward it to the DUT 250 according to a (communication) protocol.

In one example, the HighSpeed IO interface may use the SATA protocol or any other protocol which may, for example, include device-specific information (e.g., encryption, ID) and/or a handshake protocol and/or package counters and/or packetized protocols, etc. Thus, the HighSpeed IO interface 216 may send data to the device under test 250 that is formatted according to the SATA protocol or according to any other protocol. By using such a protocol, the device-specific information (e.g., encryption, ID) and non-determinisms due to the communication interfaces may be handled.

Moreover, the random-access memory (e.g. the dynamic random-access memory (DRAM) 230) may, for example, be in communication with a processor (e.g., central processing unit (CPU)) through a processor interface (PIF).

The module 200 of the automated test equipment further comprises a tester interface (IF) 220, which is, for example, coupled to the finite state machine (FSM) 210 and the main test flow control 110. The tester interface 220 is, for example, configured to enable fast communication (e.g., sends data or receives data) with low latency. Further, the tester interface 220 is preferably, but not necessarily, time deterministic considering the number of cycles per time needed for data transmission. In other words, the data delivery without resend and/or within a fixed period of time is guaranteed in some embodiments.

To conclude, the module 200 may, for example, allow to test a DUT, which may, for example, be a system-on-a-chip. The HighSpeed IO may, for example, communicate test case data to the DUT 250 using a protocol-based data stream, and may receive a protocol based data stream from the DUT 250. The HighSpeed IO 216 may, for example, take over the functionality of the extraction 124 of payload data, and may optionally be capable to signal one or more protocol events (e.g., a beginning or an end of a data transmission or of a data packet, a protocol error, a predefined protocol state, or the like). Accordingly, the FSM, or a dedicated trigger generation not shown in FIG. 2, may, for example, generate a trigger signal in response to the extracted payload and/or in response to one or more protocol events. The trigger signal may, for example, be used by the finite state machine 210 in order to control the execution of a test (e.g., in order to trigger a state transition) and/or may be forwarded to the main test flow control and/or to another device communication unit and/or to another test instrument.

Moreover, it should be noted that the module 200 of the automated test equipment can optionally be supplemented by any of the features, functionalities and details disclosed herein, both individually and taken in combination.

Figure 3:
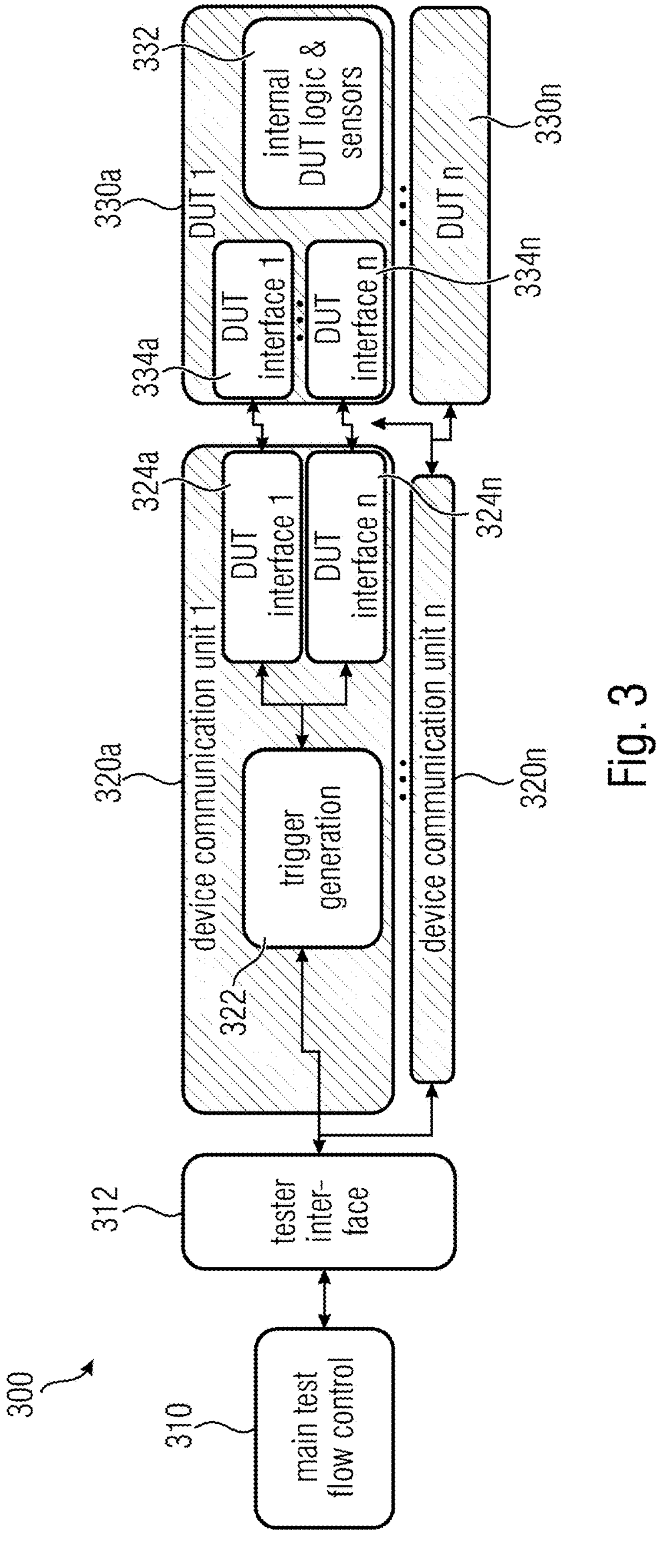
FIG. 3 shows a block schematic diagram of an automated test equipment for generating a trigger signal in response to data received from the device under test.

Example According to FIG. 3

Referring now to FIG. 3, a block schematic diagram of an automated test equipment 300, according to another embodiment of the present invention, is shown. The automated test equipment 300 comprises a main test flow control 310 (which may, for example, correspond to the main test flow control 110), wherein the main test flow control 310 is configured to operate (orchestrate) a test flow to all sites (or at least for a plurality of sites). The automated test equipment 300 further comprises at least one device communication unit (DCU) 320$a$ to 320$n$ (which may, for example, correspond to the device communication unit 120) which comprises a trigger generation 322 (which may, for example, correspond to the trigger generation 122) and at least one device under test interface 324$a$ to 324$n$. The automated test equipment 300 may, for example, test multiple devices under test 330$a$ to 330$n$ in parallel by providing the testcase data (i.e., test data) to the devices under test 330$a$ to 330$n$ and by receiving the response data (i.e., test responses) from each of the multiple devices under test 330$a$ to 330$n$. For example, the device communication unit may comprise one or more DUT interfaces 324$a$ to 324$n$ to establish connections with one or more interfaces 334$a$ to 334$n$ of the device under test 330$a$. However, alternatively, different DUT interfaces 324*a* to 324*n* may also be coupled to different devices under test, such that a single device communication unit 320*a* may simultaneously test multiple devices under test. Alternatively, a plurality of device communication units may be used to test a single device under test.

The trigger generation unit 322 is configured to communicate with (e.g., sends trigger data to or receives control data from) the main test flow control 310 via a tester interface 312 (e.g., a communication interface (bus) for the device communication unit to communicate with the main test flow control), wherein the tester interface 312 is, for example, configured to establish a bidirectional communication between the main test flow control 310 and at least one DCU 320*a* to 320*n*. Further, the tester interface 312 is, for example, configured to enable a fast communication with low latency. The said tester interface 312 may, for example, be time deterministic in the number of cycles needed for data transmission. In other words, the data delivery without resend, or data delivery within a predetermined time, may be guaranteed (i.e., the retransmission of the same data is not essential due to the reliable transmission).

Moreover, the trigger generation 322 may, for example, be (or comprise) a configurable logic reacting on a data input from the device under test 330*a*. In other words, the trigger generation 322 is configured to receive (or read) the incoming data (e.g., data, or response data, or payload data, or test result data, or sensor data) from a device under test (i.e., an external device). The incoming data from the device under test may, for example, be a sequential bit stream on possibly multiple pins in parallel or a packetized data (e.g., protocol data, or packetized protocol). The trigger generation 322 may be configured to generate the trigger signal and send the trigger signal to the tester interface 312. Furthermore, the trigger generation 322 may generate multiple triggers. However, the trigger generation may alternatively or in addition be configured to provide the trigger signal to another subunit of the device communication unit.

In the following, the trigger generation 322 implementation variants (e.g., software and configurable hardware) will be explained.

The software trigger generation may, for example, run on a central processing unit (CPU). The CPU-based approach is, for example, used for comparing the incoming data stream and generates the trigger by software instructions. By using such an approach, it is possible to have a local trigger generation on the DCU. If appropriate software concepts are applied, the approach may be time-deterministic, for example if the approach is implemented without using e.g. caches. However, this approach may be slow when compared with the hardware solution, which may be used as another alternative.

Moreover, it should be noted that the automated test equipment 300 can optionally be supplemented by any of the features, functionalities and details disclosed herein, both individually and taken in combination.

Figure 4:
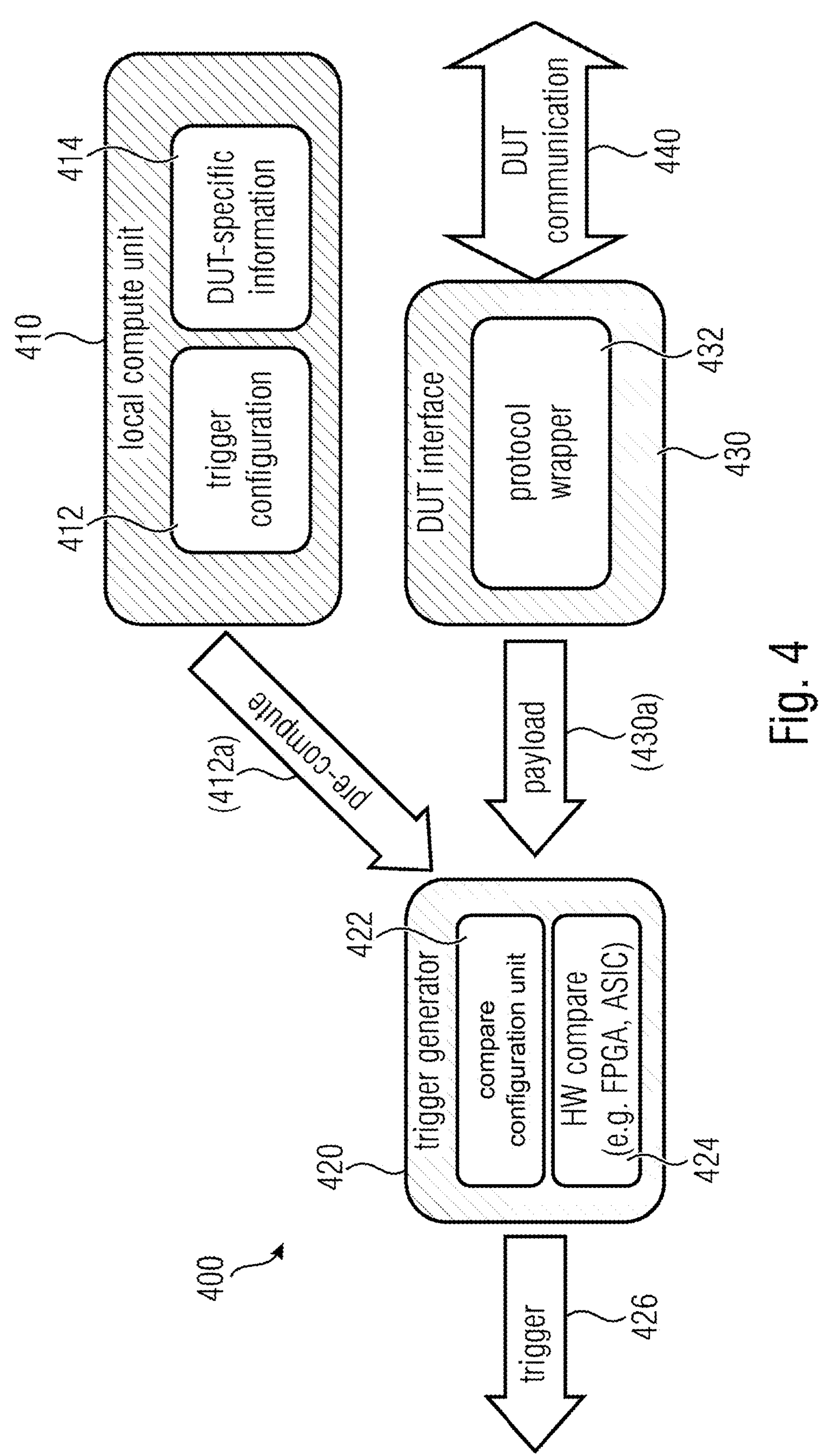
FIG. 4 shows a block schematic diagram of a trigger generation block for generating a trigger signal in response to data received from the device under test.

Example According to FIG. 4

Referring now to FIG. 4, a block schematic diagram of a trigger generation block 400 for generating a trigger signal 426 in response to the data received from the device under test, is shown. The trigger generation block 400 shown in FIG. 4 may, for example, be part of the device communication units disclosed herein.

The trigger generation block 400 comprises a trigger generator 420. The trigger generator 420 may, for example, correspond to the trigger generation 122 or 322.

The trigger generator 420 comprises a compare configuration unit 422 and a hardware (HW) compare unit 424. The compare configuration unit 422 may, for example, adapt the hardware compare unit 424 in dependence on trigger configuration information. The hardware (HW) compare unit 424 (e.g., FPGA, ASIC) may be configured to provide (i.e., generate) the trigger signal 426 to the main test flow control 110, 310.

In the configurable hardware trigger generation approach, a pre-computed information or signal 412*a* (e.g., the compare sequence) may be generated by the local compute unit 410 using a combination of the trigger configuration (or trigger configuration information) 412 and the DUT-specific information 414. The trigger generator 420 may receive the precomputed information or signal 412*a* from the local compute unit 410 and a payload data 430*a* from the device under test via the DUT interface 430. Along with the payload data 430*a*, at least one protocol event information may optionally be provided by the DUT interface 430.

The DUT interface 430 may, for example, comprise a protocol wrapper 432, which is configured to extract the payload data 430*a* from the DUT communication. Thus, the payload wrapper may, for example, be configured to use device-specific data (like decryption keys, and the like) in order to extract a "plain text" payload representation form the DUT communication 440, which may, for example, be received from a DUT via a DUT interface of a device communication unit or of an automated test equipment. Moreover, the protocol wrapper may also, optionally, provide information (or a signal) describing (or signaling) one or more protocol events (e.g., one or more predefined protocol states, like beginning or an end of a frame, or one or more protocol errors like a framing error, or a parity error, or packet loss, or the like) to the trigger generator 420.

Accordingly, the trigger generator may, for example, perform a comparison between the extracted payload data 430*a* provided by the protocol wrapper 432 of the DUT interface 430 and a pre-computed compare sequence 412*a* provided by the local compute unit, wherein the trigger generator may consider "wildcards" or "don't' cares" and may, for example, only consider a part of the extracted payload for the trigger generation. A trigger signal may be activated or provided if the comparison fulfills a predetermined condition. The trigger configuration information 412 may, for example, determine which part of the extracted payload 430*a* is considered in the comparison, and which comparison criterion is used for activating (or providing) the trigger signal.

Alternatively or in addition, the trigger generator may consider one or more protocol events, which are reported by the protocol wrapper using appropriate signals or information, when deciding about the activation of the trigger signal. For example, a trigger signal may be activated or provided in response to a predefined protocol error, or in response to a predefined combination of protocol errors, or in response to another protocol event (e.g. in response to an end of a data frame).

To conclude, the trigger generation block 400 may generate a trigger signal in a close proximity to the DUT and in a flexible configurable manner.

Moreover, it should be noted that the trigger generation block 400 can optionally be supplemented by any of the features, functionalities and details disclosed herein, both individually and taken in combination.

Applications

The said automated test equipment disclosed herein related to the testing of devices under test, in one application scenario, may particularly control the test execution through on-chip sensors of a device under test. During the test process, the test execution may, for example, run until a certain sensor temperature value (e.g., a temperature value of) 50° is reached due to heating (e.g., self-heating of on-chip) of DUT circuits. In other words, the trigger signal is related to the test execution and is generated after the detection of self-heating of on-chip (or other anomalies) in the devices under test by using different sensor types (e.g., temperature sensor).

Another application scenario may be related to the control of power supply (e.g., on different device communication unit, or in a different automated test module or in a different automated test equipment instrument) on voltage drop during the test process by generating other type of trigger signals.

Conclusions

In the following, some conclusions will be provided.

In testing concepts for testing DUTs, the test-flow may rely on the generation of trigger signals which causes changes in the overall test execution. The generation of trigger signals is required especially for interactive test-flows which are based on the results from the device under test.

It should be noted that the described embodiments according to the invention provide a better timing prediction (i.e., time synchronization for trigger generation due to a short path between the DUT interface and the trigger generation unit) with short communication latency and thus provide a better real-time performance (or processing) capability and a multi-site efficiency over conventional concepts.

The embodiments according to the invention may not be used, for example, as part of the main test flow control which may generate the trigger data with a communication latency due to the high traffic of data in the main test flow control. Rather, according to an aspect of the invention, the trigger generation unit (or the trigger generation block) is part of the device communication unit in order to minimize the communication latency. In particular, the described automated test equipment is based on the insight that the real-time trigger generation unit should be close to the DUT interface (or communication channel) in order to achieve a short communication latency during the interactive test flow.

To conclude, the said embodiments consider the real-time requirements for trigger generation in order to keep a minimal latency between the event itself, the communication of the trigger or the reaction of the test execution flow.

To conclude, embodiments according to the invention may be used to test devices under test in an efficient manner, and are therefore advantageous over other conventional concepts.

Further Aspects and Embodiments

In the following, further aspects end embodiments according to the present invention will be described. The aspects may be used individually or in combination, and may optionally be introduced into any of the embodiments disclosed herein, both individually and in combination.

According to an aspect, embodiments according to the invention create an apparatus for a real-time trigger generation system close to the DUT interface.

According to an aspect, embodiments according to the invention are related to a real time trigger generation close to the channel.

According to an aspect, test flows may rely on the generation of triggers. For example, the trigger(s) may signal the test execution flow a specified event. Also the trigger(s) may allow the flow (or test flow) to react on it (e.g., react to the trigger or to the trigger signal, or to the specified event). A generation of triggers may, for example, be required for interactive test flows, that depend on results from the DUT. According to an aspect, triggers may be comparable to interrupts in processing units.

According to an aspect there may be one or more quality requirements (e.g., with respect to a trigger generation or real-time trigger generation: Minimal latency between the event itself and the communication of the trigger/the reaction of the test execution flow; Time determinism to allow cycle accurate back mapping including trigger generation and trigger communication/broadcast; flexibility in definition of the trigger including simple bit-compare not sufficient for devices with protocol interfaces and more advanced requirement; protocol aware including needs to handle device-specific information and non-determinisms due to the communication interfaces, and handshakes, devices-parameters, sensor reading, package counters, and packetized protocols. According to an aspect of the invention, one or more or even all of these requirements may be met in the embodiments of the invention.

In the following, some building blocks, which are used in embodiments according to the invention will be discussed.

A main test flow control may be coupled to a device communication unit (DCU), wherein the device communication until is a local processing unit connected to the DUT. The main test flow control may be a main execution unit orchestrating the test flow for all sites.

Moreover, there may be a tester interface which may be a communication interface (bus) for the Device Communication Unit to communicate with the main test flow (or main test flow control). The tester interface may, for example, be coupled between the main test flow control and the device communication unit.

Moreover, there may be a trigger generation, which is a configurable logic reacting on a data (or data stream) input from the DUT to generate the trigger signal and to communicate it to the tester interface. Optionally, multiple triggers can be generated. The trigger generation may, for example, be part of the device communication unit.

Moreover, there is a DUT interface, which enables communication between the Device Communication Unit and the DUT.

Moreover, the device under test is sometimes designated as DUT or dut.

An example of an arrangements and interaction of the building blocks is shown, for example, in FIG. 3.

In the following, some (optional) details and aspects of the general underlying architecture and some requirements will be described.

The tester interface is preferably designed to allow for a fast communication with low latency. Moreover, the tester interface is preferably deterministic in the number of cycles and/or time needed for data transmission. Preferably, the tester interface allows for a guaranteed data delivery without resend. Moreover, preferably, the tester interface allows for a bidirectional communication between 1 . . . . N DCS(S) and the main test flow control.

The trigger generation may, for example, read incoming data from the device, e.g., a sequential bit stream on possibly multiple pins in parallel; and packetized data. In other words, for example, the incoming data from the device may be in the form of a packetized sequential bit stream on one pin or on multiple pins in parallel.

There are different possible implementation variants for the trigger generation.

A software trigger generation (e.g., on a CPU) may be used. The CPU-based approach may, for example, compare the incoming data stream and generate a trigger (or a trigger signal) by software instructions. The CPU based approach may, for example, be implemented local on the OCU. In some cases, the CPU-based approach is only deterministic without using caches. In some cases, the CPU-based approach is slow compared to a hardware solution.

Alternatively, or in addition, the trigger generation may be implemented using (or as) a configurable hardware trigger. For example, the configurable hardware trigger may comprise a local generation of a compare sequence, for example using a combination of configuration and DUT-specific information. For example, the configurable hardware trigger may use a local compare of a sequence (e.g., of the compare sequence) with payload (or extracted payload) from the DUT. According to an aspect, the configurable hardware trigger may comprise (or perform) an extraction of payload out of direct data from the DUT. According to an aspect, the configurable hardware trigger may unwrap protocol data. According to an aspect, the configurable hardware trigger may communicate a trigger to, e.g., a main tester interface. According to another aspect, the configurable hardware trigger may communicate a trigger to, e.g., a local transmit to (one or more) different device communication units (DCUs), which may, for example, be connected to the same device (or to the same DUT).

An example of a trigger generation (or of a trigger generation block) is shown in FIG. 4.

In the following, some optional aspects and details with respect to the trigger (or trigger signal) will be provided. According to an aspect, a trigger (or trigger signal) consists of (or comprises) one or more of the following items: Timestamp (e.g. Clock Cycles since reference point); Trigger Type; Trigger Origin (e.g., DUT, DCU); Payload data; Trigger Target; Priority and Age.

In the following, some optional aspects and details with respect to the trigger distribution will be provided. For example, the trigger distribution may be performed using a central distributor, e.g., from the DCU to the Central (or central distributor), and from the Central (or central distributor) to the DCU. As another example, the trigger distribution may be performed using a bus communication and using a listening of target DCUs on the bus. According to another example, there may be a direct trigger communication to a target DCU, e.g., using a loopback over e.g., a load board.

In the following, some optional aspects and details with respect to the trigger compare will be described.

For example, there may be one, two or more of the following states: Activate, fire if activation condition matched; disable, no matching of activation condition; and enable, enable matching activation condition.

For example, there may be a transition from the disable state to the enable state, when a first condition is met or when a trigger mechanism is enabled by a control of the DCU, and there may be a transition from the enable state to the activate state when a second condition is met, and there may be a provision (or activation) of a triggers signal, when the activation condition is met. However, different functionalities are also possible.

Moreover, one or more of the following condition types may, for example, be used: Match of bit stream (e.g. of extracted payload with a pre-computed reference stream), Perfect match, Partial match with wildcards, Regular expressions; Cycle after reference condition Global sync reference, activation, disable, enable; Numerical operation compare; Min/max Number of matches; and React on direct command (e.g. from OUT, from Tester Interface).

In the following, some optional aspects and details with respect to the DUT interface will be described. According to an aspect, the DUT interface allows for a protocol-aware communication between DCU and DUT. According to an aspect, the DUT interface may perform an unwrapping of payload from the raw device communication.

According to an aspect, one or more of the following communication interfaces (or communication interface types) may be used (e.g., as the DUT interface, or as multiple DUT interfaces): JTAG (IEEE 1149.x); IJTAG (IEEE 1687.x); Boundary Scan (IEEE 1500); HighSpeed IO test access; IEEE1149.10, “over USB” or leveraging one or more USB functionalities, “Over Ethernet” or leveraging one or more Ethernet functionalities, and “Over SATA” or leveraging one or more SATA functionalities; Ethernet; USB; SATA; and Debug interfaces, e.g. TAP.

It should be noted that IEEE 1149.10 is a standard for a generic high speed test access to the DUT, which leverages parts (e.g. PHY, (de-) serializer, bit and word alignment unit) of existing HSIO interfaces such as USB, Ethernet, SATA. It does not use the existing controllers as a whole.

In the following, some possible applications will be described.

According to an aspect, embodiments according to the invention may be used to implement an on-chip sensor controlled test flow.

According to an aspect, a readout of on-chip sensor information may be performed. For example, a test execution until an on-chip sensor signals 50 degree may be performed. As another example, a control of a power supply (e.g., on a different DCU) on a voltage drop may be performed.

In the following, possible improvements of embodiments according to the invention over the prior art will be discussed.

According to an aspect, a delay (e.g., of a trigger) due to a transmission of data (e.g., to a central execution unit) and due to a centralized generation of triggers can be avoided (e.g., because a decentralized trigger generation is used in embodiments).

Moreover, a high traffic on a central data bus (e.g. a tester interface) is avoided when using embodiments according to the invention.

Moreover, using embodiments according to the invention, it is possible to maintain cycle accuracy.

Also, embodiments according to the invention show a good real-time performance and a good multi-site efficiency.

Also, embodiments according to the invention comprise good multi-site possibilities.

Moreover, using embodiments according to the invention, it is possible to efficiently control tester resources, such as power supplies.

Embodiments according to the invention can deal with non-deterministic interfaces and are suitable for protocol aware (or protocol aware communication).

Embodiments according to the invention allow for content-aware implementation.

Embodiments according to the invention may take into account (or consider) device specific information.

Embodiments according to the invention may allow for a simple match of bit sequences.

Thus, embodiments according to the invention may provide a large number of advantages over conventional approaches.

Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine-readable carrier.

Other embodiments comprise the computer program for performing one of the methods described herein, stored on a machine-readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

The above-described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Furthermore, the foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A test system comprising:

a main test flow controller; and a device communication unit configured to be directly coupled to a device under test (DUT), the device communication unit including a trigger generation unit configured to generate a trigger signal in response to protocol-based data received from the DUT and to communicate the trigger signal to the main test flow controller.

2. The test system of claim 1, wherein:

the main test flow controller is configured to control execution of a test of the DUT;

the protocol-based data is generated based on the execution of the test of the DUT; and the trigger signal is configured to cause the main test flow controller to change the execution of the test of the DUT.

3. The test system of claim 1, further comprising a device under test interface operable for real-time communication between the trigger generation unit and the DUT.

4. The test system of claim 3, wherein the device under test interface comprises a JTAG interface, an IJTAG interface, a boundary scan interface, a USB interface, an Ethernet interface, a SATA interface, a debug interface, a HighSpeed IO interface according to IEEE 1149.10, a wireless interface according to IEEE 802.11, 3GPP LTE, or 3GPP 5G.

5. The test system of claim 3, wherein the device under test interface is deterministic with respect to a time needed for a data transmission between the DUT and the device communication unit.

6. The test system of claim 1, further comprising a tester interface coupling the trigger generation unit to the main test flow controller.

7. The test system of claim 1, wherein the trigger generation unit is configured to generate extracted payload data by extracting payload data from the protocol-based data received from the DUT and further to generate the trigger signal in response to the extracted payload data.

8. The test system of claim 1, wherein the trigger generation unit is configured generate the trigger signal in response to one or more protocol events of the protocol-based data.

9. A test system comprising:

a plurality of device communication units;

a tester interface coupling the plurality of device communication units to a main test flow controller;

one or more DUT interfaces operable to directly couple the plurality of device communication units to a plurality of devices under test (DUTs); and wherein the plurality of device communication units including;

a respective protocol wrapper of respective one of the plurality of device communication units operable to extract payload data from data received from one or more respective DUTs; and a respective trigger generation unit operable to generate a trigger signal in response to the payload data extracted from the data received from respective ones of the one or more respective DUTs and to send the trigger signal to one or more of the main test flow controller and the plurality of DUTs.

10. The test system of claim 9, wherein the respective trigger generation unit includes a respective compare unit for determining the trigger signal from the payload data and expected data.

11. The test system of claim 10, wherein the plurality of device communication units further includes a respective trigger configuration unit to configure the respective compare unit based on common and device specific expected data.

12. The test system of claim 10, wherein the respective compare unit is configured to evaluate a match of the payload data according to a perfect match trigger condition, a partial match with wildcards trigger condition, a regular expression trigger condition, a minimum number of matches trigger condition or a maximum number of matches trigger condition.

13. The test system of claim 9, wherein the trigger signal includes one or more information items selected from a group consisting of a timestamp describing a time at which a trigger event is detected, information about a trigger type, information about a trigger origin, information about payload data, information about a trigger target, information about a trigger priority, and information about an age.

14. The test system of claim 9, wherein the main test flow controller is configured to send, in response to the trigger signal received from a given one of the plurality of device communication units, a trigger message to one or more others of the plurality of device communication units, one or more trigger targets or one or more tester instruments.

15. A test system comprising:

a tester interface;

one or more device under test interfaces; and a plurality of device communication units coupled between the tester interface and the one or more device under test interfaces, each device communication unit directly receiving protocol-based device under test result data on respective ones of the one or more device under test interfaces, generating one or more cycle accurate test flow control trigger signals in response to the protocol-based device under test result data, and further for outputting the one or more cycle accurate test flow control trigger signals on the tester interface.

16. The test system of claim 15, wherein each device communication unit includes:

a respective protocol wrapper to extract payload data from the protocol-based device under test result data; and a respective trigger generation unit to generate the one or more cycle accurate test flow control trigger signals in response to the payload data extracted from the protocol-based device under test result data.

17. The test system of claim 15, wherein each device communication unit includes a respective trigger generation unit to generate the one or more cycle accurate test flow control trigger signals in response to one or more protocol events from the protocol-based device under test result data.

18. The test system of claim 15, wherein the one or more cycle accurate test flow control trigger signals comprise one or more different trigger states including an activate state, a disable state, an enable state and multi-step state.

19. The test system of claim 15, further comprising:

a main test flow controller coupled to the plurality of device communication units by the tester interface, wherein the main test flow controller is configured to control a test flow of a test of a plurality of devices under test (DUTs) coupled to the plurality of device communication units by the one or more device under tests interfaces.

20. The test system of claim 19, wherein the one or more cycle accurate test flow control trigger signals are configured to cause the main test flow controller to change the test flow of the test of one or more of the plurality of DUTs.

* * * * *